US008846437B2

(12) United States Patent
Singh et al.

(10) Patent No.: US 8,846,437 B2
(45) Date of Patent: Sep. 30, 2014

(54) HIGH EFFICIENCY THIN FILM TRANSISTOR DEVICE WITH GALLIUM ARSENIDE LAYER

(75) Inventors: Kaushal K. Singh, Santa Clara, CA (US); Robert Jan Visser, Menlo Park, CA (US); Srikant Rao, Powai Mumba (IN); Bhaskar Kumar, Santa Clara, CA (US); Claire J. Carmalt, Rickmansworth Hertfordshire (GB); Ranga Rao Arnepalli, Veeravalli Andhrapradesh (IN); Omkaram Nalamasu, San Jose, CA (US); Gaurav Saraf, Santa Clara, CA (US); Sanjayan Sathasivam, Finchley (GB); Christopher Stuart Blackman, Marlow (GB)

(73) Assignee: Applied Materials, Inc., Santa Clara, CA (US)

( * ) Notice: Subject to any disclaimer, the term of this patent is extended or adjusted under 35 U.S.C. 154(b) by 272 days.

(21) Appl. No.: 13/250,748

(22) Filed: Sep. 30, 2011

(65) Prior Publication Data

US 2012/0080092 A1    Apr. 5, 2012

Related U.S. Application Data

(60) Provisional application No. 61/388,943, filed on Oct. 1, 2010, provisional application No. 61/452,801, filed on Mar. 15, 2011, provisional application No. 61/468,918, filed on Mar. 29, 2011.

(51) Int. Cl.
| | | |
|---|---|---|
| H01L 21/00 | (2006.01) | |
| H01L 21/02 | (2006.01) | |
| B82Y 30/00 | (2011.01) | |
| H01L 31/18 | (2006.01) | |
| H01L 31/072 | (2012.01) | |
| H01L 31/0352 | (2006.01) | |
| H01L 51/42 | (2006.01) | |
| C23C 16/56 | (2006.01) | |
| H01L 31/075 | (2012.01) | |
| H01L 31/0224 | (2006.01) | |
| C23C 16/30 | (2006.01) | |
| H01L 51/00 | (2006.01) | |

(52) U.S. Cl.
CPC ........... B82Y 30/00 (2013.01); H01L 21/02576 (2013.01); H01L 21/02601 (2013.01); H01L 31/184 (2013.01); H01L 31/072 (2013.01); H01L 21/02546 (2013.01); H01L 21/02628 (2013.01); *Y02E 10/549* (2013.01); H01L 31/035227 (2013.01); H01L 21/02579 (2013.01); H01L 31/1864 (2013.01); H01L 51/424 (2013.01); C23C 16/56 (2013.01); H01L 21/0262 (2013.01); H01L 21/0237 (2013.01); H01L 21/02491 (2013.01); *Y02E 10/544* (2013.01); H01L 31/075 (2013.01); H01L 51/0048 (2013.01); H01L 31/022425 (2013.01); *Y02E 10/548* (2013.01); *C23C 16/301* (2013.01)
USPC ............... 438/77; 438/57; 257/458; 136/252; 136/262

(58) Field of Classification Search
CPC ....................... H01L 3131/184; H01L 31/1865
USPC ................ 136/252, 262; 438/57, 77; 257/458
See application file for complete search history.

(56) References Cited

U.S. PATENT DOCUMENTS

| | | | |
|---|---|---|---|
| 4,923,524 A | | 5/1990 | Kiss |
| 4,975,299 A | * | 12/1990 | Mir et al. ...................... 438/483 |
| 2001/0049152 A1 | * | 12/2001 | Taniguchi et al. .............. 438/24 |
| 2002/0050288 A1 | * | 5/2002 | Suzuki .......................... 136/255 |
| 2010/0012170 A1 | | 1/2010 | Varonides et al. |
| 2010/0044696 A1 | | 2/2010 | Cheng et al. |
| 2010/0096004 A1 | * | 4/2010 | Hu et al. ...................... 136/256 |
| 2010/0096634 A1 | | 4/2010 | Park et al. |

FOREIGN PATENT DOCUMENTS

| | | |
|---|---|---|
| EP | 2116899 A2 | 11/2009 |
| JP | 10092747 A | 4/1998 |

OTHER PUBLICATIONS

PCT international search report and written opinion of PCT/US2011/054301 dated Apr. 24, 2012.
PCT international search report and written opinion of PCT/US2011/054306 dated Apr. 24, 2012.
Joanna Prazmowska et al. "Solar cells conversion efficiency enhancement techniques," Optica Applicata, 2007 vol. XXXVII, No. 1-2, p. 93-99.

\* cited by examiner

*Primary Examiner* — Kimberly Rizkallah
*Assistant Examiner* — Maria Ligai
(74) *Attorney, Agent, or Firm* — Patterson & Sheridan, LLP

(57) ABSTRACT

Embodiments of the invention provide a method of forming a doped gallium arsenide based (GaAs) layer from a solution based precursor. The doped gallium arsenide based (GaAs) layer formed from the solution based precursor may assist solar cell devices to improve light absorption and conversion efficiency. In one embodiment, a method of forming a solar cell device includes forming a first layer with a first type of dopants doped therein over a surface of a substrate, forming a GaAs based layer on the first layer, and forming a second layer with a second type of dopants doped therein on the GaAs based layer.

15 Claims, 7 Drawing Sheets

HIGH EFFICIENCY THIN FILM TRANSISTOR DEVICE WITH GALLIUM ARSENIDE LAYER

CROSS-REFERENCE TO RELATED APPLICATIONS

This application claims benefit of U.S. Provisional Application Ser. No. 61/388,943 filed Oct. 1, 2010, U.S. Provisional Application Ser. No. 61/452,801 filed Mar. 15, 2011 and U.S. Provisional Application Ser. No. 61/468,918, filed Mar. 29, 2011, all of which are incorporated by reference in their entirety.

BACKGROUND OF THE INVENTION

1. Field of the Invention

Embodiments of the present invention generally relate to solar cells and methods for forming the same. More particularly, embodiments of the present invention relate to a gallium arsenide (GaAs) based solar cells.

2. Description of the Related Art

Solar cells convert solar radiation and other light into usable electrical energy. The energy conversion occurs as the result of the photovoltaic effect. Solar cells may be formed from crystalline material or from amorphous or microcrystalline materials. Generally, there are two major types of solar cells that are produced in large quantities today, which are crystalline silicon solar cells and thin film solar cells. Crystalline silicon solar cells typically use either monocrystalline substrates (i.e., single-crystal substrates of pure silicon) or a multicrystalline silicon substrates (i.e., poly-crystalline or polysilicon). Additional film layers are deposited onto the silicon substrates to improve light capture, form the electrical circuits, and protect the devices. Suitable substrates include glass, metal, and polymer substrates. It has been found that the properties of thin-film solar cells degrade over time upon exposure to light, which can cause the device stability to be less than desired. Typical solar cell properties that may degrade are the fill factor (FF), short circuit current, and open circuit voltage (Voc).

Thin film silicon solar cells have gained a significant market share due to low-cost, large-area deposition of the amorphous-microcrystalline silicon absorber layers. Thin-film solar cells use thin layers of materials deposited on suitable substrates to form one or more p-n junctions. Generally, different material layers perform different functions in the solar cells. Some material layers are configured to reflect and scatter light in the solar cells formed on the substrate so as to assist light retaining in the solar cell for a longer current generation. In some instances, some material layers may serve as a light absorber layer that may have high light-trapping effect. The light-trapping effect absorbs light in the absorber layer to generate high current. In general, the light absorber layer is configured to absorb photons with minimum recombination before they reach the solar cell electrodes and generate photocurrent. However, some absorber layers are often defective with high densities of recombination sites that have a significant detrimental effect on the efficiency of the solar devices.

Therefore, there is a need for improved thin film solar cells and methods and apparatus for forming the same with minimum recombination of electron-hope pairs to improve conversion efficiency of the solar cell.

SUMMARY OF THE INVENTION

Embodiments of the invention provide a method of forming a gallium arsenide based (GaAs) layer with or without dopants from a solution based precursor. The gallium arsenide based (GaAs) layer formed from the solution based precursor may be incorporated in solar cell devices to improve light absorption and conversion efficiency. In one embodiment, a method of forming a solar cell device includes forming a first layer with a first type of dopants doped therein over a surface of a substrate, forming a GaAs based layer on the first layer, and forming a second layer with a second type of dopants doped therein on the GaAs based layer.

In another embodiment, a method of forming a solar cell device includes supplying a GaAs containing precursor in a solvent to processing chamber, the GaAs containing precursor having p-type or n-type dopants disposed therein, and evaporating the solvent from the GaAs containing precursor with p-type dopants or n-type dopants in the processing chamber to form a p-type doped or n-type doped GaAs layer on the substrate.

In yet another embodiment, a solar cell device includes a first layer having a first type of dopants doped therein disposed on a substrate, a GaAs based layer formed over the first layer, and a second layer formed over the GaAs based layer.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Solar cell devices that are formed using thin film deposition processes generally comprise numerous layers of material, or films, of differing composition that can be put together in many different ways. Most films used in such devices incorporate a semiconductor element that may comprise silicon, germanium, gallium, arsenide, indium, carbon, boron, phosphorous, nitrogen, oxygen, hydrogen and the like. Characteristics of the different deposited films include degrees of crystallinity, dopant type, dopant concentration, band gap, film refractive index, film extinction coefficient, film transparency, film absorption, and conductivity.

Charge generation during a photovoltaic process is generally provided by one or more light absorber layers. Typically, the electron-hole pair generation process predominantly occurs in an intrinsic layer that is used to space the oppositely doped p-n regions of a p-i-n type thin film solar cell device apart. The phrase "intrinsic layer" is typically used to distinguish it from the various doped layers present in the solar cell. The intrinsic layer may have different film properties, which may influence its light-absorbing characteristics and electron-hole pair generation process. Aspects of the present invention generally provide a device structure and method for forming a GaAs based light absorber layer with desired optical properties to assist in absorption of light within a broad range of wavelength. By utilizing a GaAs based light absorbing layer along with amorphous and/or microcrystalline silicon layers to form photovoltaic junctions in a solar cell device, a high light absorption efficiency and conversion efficiency can be obtained.

Figure 1:
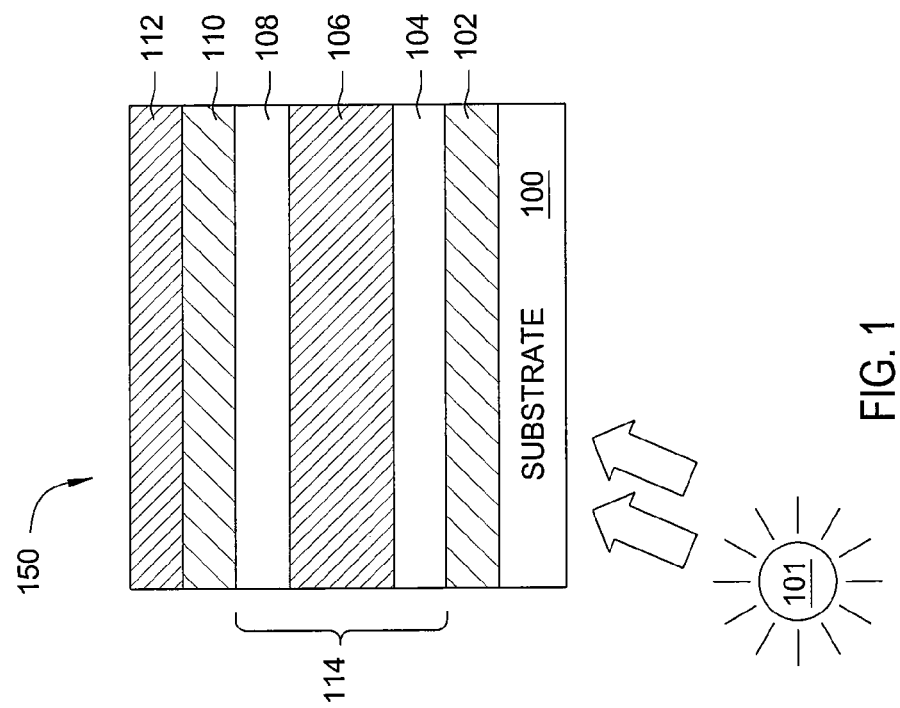
FIG. 1 is a cross sectional view of a single junction thin-film solar cell having a GaAs layer as a light absorber layer according to one embodiment of the invention.

FIG. 1 is a cross section view of one embodiment of a single junction solar cell device 150 oriented towards a light emitting source, or solar radiation 101. Solar cell device 150 comprises a substrate 100, such as a glass substrate, polymer substrate, or other suitable substrate, with thin films formed thereover. The solar cell device 150 further comprises a first transparent conductive oxide (TCO) layer 102 formed over the substrate 100, a p-i-n junction 114 formed over the first TCO layer 102, a second TCO layer 110 formed over the p-i-n junction 114, and a metal back layer 112 formed over the second TCO layer 110.

To improve light absorption by enhancing light trapping, the substrate and/or one or more of thin films formed thereover may be optionally textured by use of a wet processing technique, plasma processing technique, ion bombardment processing technique, and/or mechanical processing technique. In one embodiment, the interface surface in the first TCO layer 102 is textured (not shown), so that the subsequent thin films deposited thereover will generally follow the textured topography of the surface below it.

In one embodiment, the first TCO layer 102 and the second TCO layer 110 may each comprise tin oxide, zinc oxide, aluminum zinc oxide, aluminum tin oxide, indium tin oxide, cadmium stannate, combinations thereof, or other suitable materials. It is understood that the TCO materials may also include additional dopants and components. For example, zinc oxide may further include dopants, such as aluminum, gallium, boron, and other suitable dopants. Zinc oxide comprises 5 atomic percent (%) or less of dopants, for example comprising 2.5 atomic % or less aluminum. In certain instances, the substrate 100 may be provided by the glass manufacturers with the first TCO layer 102 already provided.

The first p-i-n junction 114 comprises a p-type layer 104, an intrinsic type gallium arsenide (GaAs) based layer 106 formed over the p-type layer 104, and an n-type layer 108 formed over the intrinsic type gallium arsenide (GaAs) based layer 106. In one embodiment, the p-type layer 104 is configured to be a p-type gallium arsenide (GaAs) based layer 104 and the n-type layer 108 is configured to be a n-type gallium arsenide (GaAs) based layer 108 both formed from one or more gallium arsenide (GaAs) based layer or doped gallium arsenide (GaAs) based layer. The intrinsic type gallium arsenide (GaAs) layer 106 disposed between the p-type gallium arsenide (GaAs) based layer 104 and the n-type gallium arsenide (GaAs) based layer 108 provides a greater amount of light absorption over a wide range of wavelengths of light and has a greater carrier mobility as compared to conventional thin film solar cell devices. Methods and processes of forming the p-type, intrinsic type and n-type gallium arsenide (GaAs) layers 104, 106, 108 in the solar cell device 150 will be further described below with referenced to FIGS. 2-5. Although it is believed that the p-type, intrinsic and n-type type gallium arsenide (GaAs) layers 104, 106, 108 may be best obtained and formed by a solution based GaAs precursor which will be further described below, it is noted that the p-type, intrinsic type and n-type gallium arsenide (GaAs) layers 104, 106, 108 may also be obtained by any other suitable manners. In certain embodiments, the p-type gallium arsenide (GaAs) based layer 104 has a thickness between about 60 Å and about 300 Å. In certain embodiments, the intrinsic type gallium arsenide (GaAs) based layer 106 has to a thickness between about 1,500 Å and about 3,500 Å. In certain embodiments, the n-type gallium arsenide (GaAs) based layer 108 has a thickness between about 200 Å and about 500 Å.

The metal back layer 112 may include, but not limited to a material selected from the group consisting of Al, Ag, Ti, Cr, Au, Cu, Pt, alloys thereof, or combinations thereof. Other processes may be performed to form the solar cell device 150, such a laser scribing processes. Other films, materials, substrates, and/or packaging may be provided over metal back layer 112 to complete the solar cell device. The formed solar cells may be interconnected to form modules, which in turn can be connected to form solar cell arrays.

Optionally, in one embodiment, the solar cell device 150 comprises a multiple junction solar cell device. In this configuration, one or more additional p-i-n junctions may be formed between the first p-i-n junction 114 and the second TCO layer 110, or between the first TCO layer 102 and the first p-i-n junction 114, as will be further discussed below with referenced to FIG. 2. The one or more additional p-i-n junctions may be formed from layers having similar or differing composition from the layers found in the first p-i-n junction 114. For example, one or more of the additional junctions may comprise an intrinsic layer that is formed from a material that has a different band gap than the intrinsic type gallium arsenide (GaAs) layer 106.

Solar radiation 101 is primarily absorbed by the intrinsic type gallium arsenide (GaAs) layer 106 of the p-i-n junction 114 and is converted to electron-hole pairs. The electric field created between the p-type gallium arsenide (GaAs) based layer 104 and the n-type gallium arsenide (GaAs) based layer 108 that stretches across the intrinsic type gallium arsenide (GaAs) layer 106 causes electrons to flow toward the n-type gallium arsenide (GaAs) based layers 108 and holes to flow toward the p-type gallium arsenide (GaAs) based layers 104 creating a current. Therefore, since the intrinsic type gallium arsenide (GaAs) layer 106 is able to capture a wider range of the solar radiation spectrum, the formed solar cell 100 will be more efficient than conventional solar cell devices.

In another embodiment, p-type dopants present in the p-type gallium arsenide (GaAs) based layer 104 may be selected from a group consisting of zinc containing materials, magnesium containing materials, carbon containing materials, or the like. Suitable examples of the zinc containing materials include metallic zinc dopants, dimethyl zinc (DMZ), diethyl zinc (DEZ), or other suitable zinc containing materials. Suitable examples of magnesium containing material include metallic magnesium dopants, cyclopentadienyl magnesium, or other suitable magnesium containing material. Suitable examples of carbon containing materials include carbon chlorine ($CCl_4$), carbon bromide ($CBr_4$) or the like. N-type dopants present in the n-type gallium arsenide (GaAs) based layer 108 may be selected from a group consisting of sulfur containing materials, silicon containing materials, selenium containing materials, or the like. Suitable examples of sulfur containing materials include $H_2S$, sulfur, or the like. Suitable examples of silicon containing materials include silane ($SiH_4$), disilane ($Si_2H_6$), or the like. Suitable examples of selenium containing material include $H_2Se$, Se or the like. In one example, the p-type dopants used to form the p-type gallium arsenide (GaAs) based layer 104 is zinc containing material so as to form a zinc doped gallium arsenide (GaAs) layer. The n-type dopants used to form the n-type gallium arsenide (GaAs) based layer 108 is silicon containing material so as to form a silicon doped gallium arsenide (GaAs) layer. Details regarding how to have dopants doped into the gallium arsenide (GaAs) based layer will be further described below with reference to FIGS. 5-6.

Alternatively, in some embodiments, the p-type layer 104 and the n-type layer 108 formed in the first p-i-n junction 114 may be silicon based layer, such as a silicon containing layer having p-type dopants or n-type dopants doped therein. The intrinsic type gallium arsenide (GaAs) layer 106 formed over the p-type silicon layer containing 104, and the n-type silicon containing layer 108 formed over the intrinsic type gallium arsenide (GaAs) layer 106. The p-type silicon layer 104 and the n-type silicon layer 108 may be formed from one or more p-type or n-type microcrystalline layers or one or more p-type or n-type amorphous silicon layers. The intrinsic type gallium arsenide (GaAs) layer 106 disposed between the p-type silicon layer 104 and the n-type silicon layer 108 provides a greater amount of light absorption over a wide range of wavelengths of light and has a greater carrier mobility than other conventional silicon based thin film solar cell devices. Although it is believed that the intrinsic type gallium arsenide (GaAs) layer 106 may be best obtained and formed by a solution based GaAs precursor which will be further described below with referenced to FIGS. 3-6, it is noted that the intrinsic type gallium arsenide (GaAs) layer 106 may also be obtained by any suitable manners available in the art. In certain embodiments, the p-type silicon containing layer 104 is an amorphous silicon layer may be formed to a thickness between about 60 Å and about 300 Å. In certain embodiments, the n-type silicon containing layer 108 may be formed to a thickness between about 1,500 Å and about 3,500 Å. In certain embodiments, the n-type silicon containing layer 108 is an n-type amorphous silicon layer that may be formed to a thickness between about 100 Å and about 400 Å.

In this particular exemplary embodiment wherein the p-type layer 104 and the n-type layer 108 are silicon containing layers, p-type dopants formed in the p-type silicon containing layer 104 are generally Group III elements, such as boron or aluminum. N-type dopants formed in the n-type silicon containing layer 108 are generally Group V elements, such as phosphorus, arsenic, or antimony. In most embodiments, boron is used as the p-type dopant and phosphorus as the n-type dopant. These dopants may be added to the p-type and n-type layers 104, 108 described above by including a boron-containing compound or a phosphorus-containing compound in the reaction mixture during the deposition process. Suitable boron and phosphorus compounds generally comprise substituted and unsubstituted lower borane and phosphine oligomers. Some suitable boron compounds include trimethylboron ($B(CH_3)_3$ or TMB), diborane ($B_2H_6$), borane ($BH_3$), boron trifluoride ($BF_3$), and triethylboron ($B(C_2H_5)_3$ or TEB). Phosphine is the most common phosphorus compound. The dopants are generally provided with carrier gases, such as hydrogen, helium, argon, and other suitable gases.

In one embodiment, the p-type silicon containing layer 104 may be deposited by providing a gas mixture of hydrogen gas to silane gas in a ratio by volume of about 20:1 or less. Silane gas may be provided at a flow rate between about 1 sccm/L and about 10 sccm/L. Hydrogen gas may be provided at a flow rate between about 5 sccm/L and 60 sccm/L. Trimethylboron may be provided at a flow rate between about 0.005 sccm/L and about 0.05 sccm/L. If trimethylboron is provided in a 0.5% molar or volume concentration in a carrier gas, then the dopant/carrier gas mixture may be provided at a flow rate between about 1 sccm/L and about 10 sccm/L. Applying RF power between about 15 mWatts/$cm^2$ and about 200 mWatts/$cm^2$ at a chamber pressure between about 0.1 Torr and 20 Torr, such as between about 1 Torr and about 4 Torr, will deposit a p-type amorphous silicon layer at about 100 Å/min or more.

In the embodiment wherein the n-type silicon containing layer 108 is formed as an n-type amorphous silicon layer, the n-type silicon containing layer 108 may be deposited by providing a gas mixture of hydrogen gas to silane gas in a ratio by volume of about 20:1 or less, such as about 5:5:1 or 7.8:1. Silane gas may be provided at a flow rate between about 0.1 sccm/L and about 10 sccm/L, such as between about 1 sccm/L and about 10 sccm/L, between about 0.1 sccm/L and 5 sccm/L, or between about 0.5 sccm/L and about 3 sccm/L, for example about 1.42 sccm/L or 5.5 sccm/L. Hydrogen gas may be provided at a flow rate between about 1 sccm/L and about 40 sccm/L, such as between about 4 sccm/L and about 40 sccm/L, or between about 1 sccm/L and about 10 sccm/L, for example about 6.42 sccm/L or 27 sccm/L. Phosphine may be provided at a flow rate by volume between about 0.0005 sccm/L and about 0.075 sccm/L, such as between about 0.0005 sccm/L and about 0.0015 sccm/L or between about 0.015 sccm/L and about 0.03 sccm/L, for example about 0.0095 sccm/L or 0.023 sccm/L. If phosphine is provided in a 0.5% molar or volume concentration in a carrier gas, then the dopant/carrier gas mixture may be provided at a flow rate by volume between about 0.1 sccm/L and about 15 sccm/L, such as between about 0.1 sccm/L and about 3 sccm/L, between about 2 sccm/L and about 15 sccm/L, or between about 3 sccm/L and about 6 sccm/L, for example about 1.9 sccm/L or about 4.71 sccm/L. Applying RF power between about 25 mW/$cm^2$ and about 250 mW/$cm^2$, such as about 60 mW/$cm^2$ or about 80 mW/$cm^2$, at a chamber pressure between about 0.1 Torr and about 20 Torr, such as between about 0.5 Torr and about 4 Torr, such as about 1.5 Torr, will deposit an n-type amorphous silicon layer at a rate of about 100 Å/min or more, such as about 200 Å/min or more, such as about 300 Å/min or about 600 Å/min.

Figure 2:
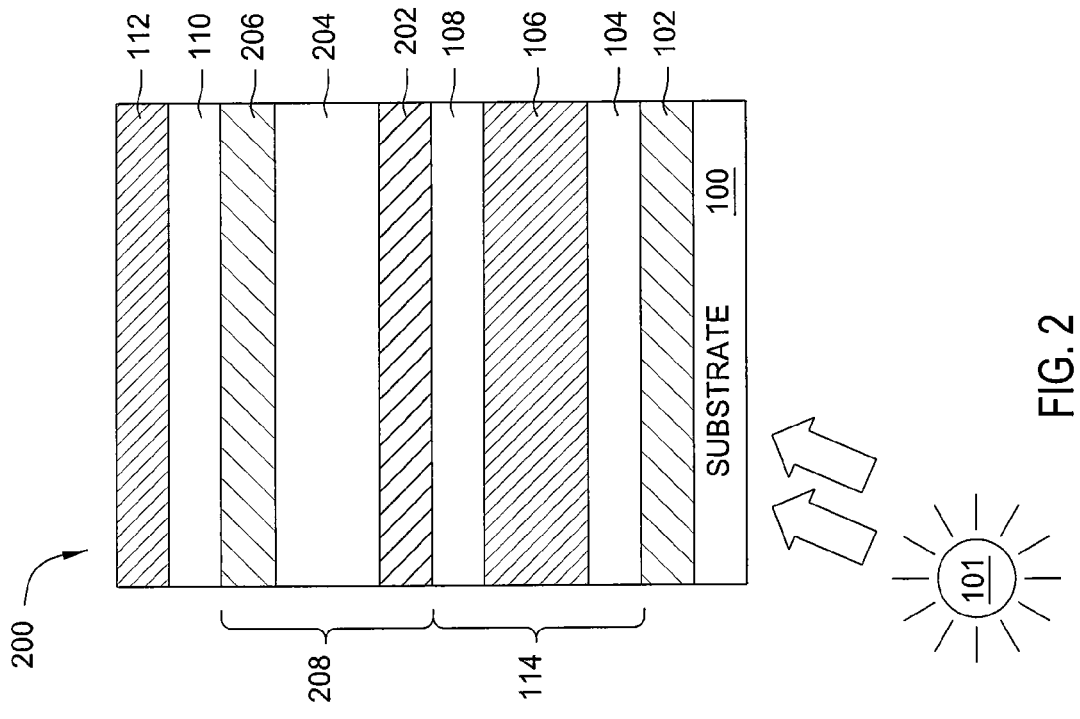
FIG. 2 is a cross sectional view of a tandem junction thin-film solar cell having a GaAs layer as a light absorber layer according to one embodiment of the invention.

FIG. 2 is a schematic diagram of an embodiment of a tandem junction solar cell 200 oriented toward the light or solar radiation 101. The solar cell 200 includes a similar device structure as described in FIG. 1, including the first transparent conductive oxide (TCO) layer 104 formed over the substrate 100, the first p-i-n junction 114 formed over the first TCO layer 102. Beside for the first p-i-n junction 114 formed over the first TCO layer 102, a second p-i-n junction 208 is formed over the first p-i-n junction 114. The second p-i-n junction 208 includes a second p-type layer 202, a second intrinsic type gallium arsenide (GaAs) based layer 204 and a second n-type layer 206. In one embodiment, the second p-type layer 202 may be a second type gallium arsenide (GaAs) based layer 202 is similar to the first p-type gallium arsenide (GaAs) based layer 102 having a desired p-type dopant doped into a gallium arsenide (GaAs) based layer. The second intrinsic type gallium arsenide (GaAs) based layer 204 is similar to the first intrinsic type gallium arsenide (GaAs) based layer 106 formed as a gallium arsenide (GaAs) layer without dopants. The second n-type layer 206 may be a second n-type gallium arsenide (GaAs) based layer is similar to the first n-type gallium arsenide (GaAs) based layer 108 with desired n-type dopants doped therein. In another embodiment, the second p-type layer 202 may be a silicon based layer with p-type dopants disposed therein while the second n-type layer 206 may be a n-type silicon layer with n-type dopants doped therein as discussed above.

In one example, the p-type dopants selected to dope into the second p-type gallium arsenide (GaAs) based layer 202 is zinc containing material, and the n-type dopants selected to dope into the second n-type gallium arsenide (GaAs) based layer 206 is a silicon containing material. After the second p-i-n junction 208 is formed on the first p-i-n junction 114, the second TCO layer 110 and the metal back layer 112 are then formed over the second p-i-n junction 208, similar to the manner described above to form the solar cell device 150 with reference to FIG. 1.

It is noted that although the embodiments depicted in FIGS. 1 and 2 are both in p-i-n junction configurations, the junctions may also be formed in a reverse order, such as a n-i-p junction having a n-type doped GaAs layer or n-type doped silicon containing layer formed prior to an intrinsic type GaAs layer and a p-type doped GaAs layer or a p-type doped silicon containing layer, as needed. Furthermore, in some configurations, the intrinsic type GaAs layer may also be eliminated, leaving only a p-n junction (e.g., having a p-type doped GaAs layer formed adjacent to a n-type doped GaAs layer) formed on a substrate. In certain embodiment, multiple doped layers, such as more than one p-type doped GaAs layer or n-type doped GaAs layer, may also be utilized to form p-i-n, n-i-p, p-n, or n-p junctions as needed.

Figure 3:
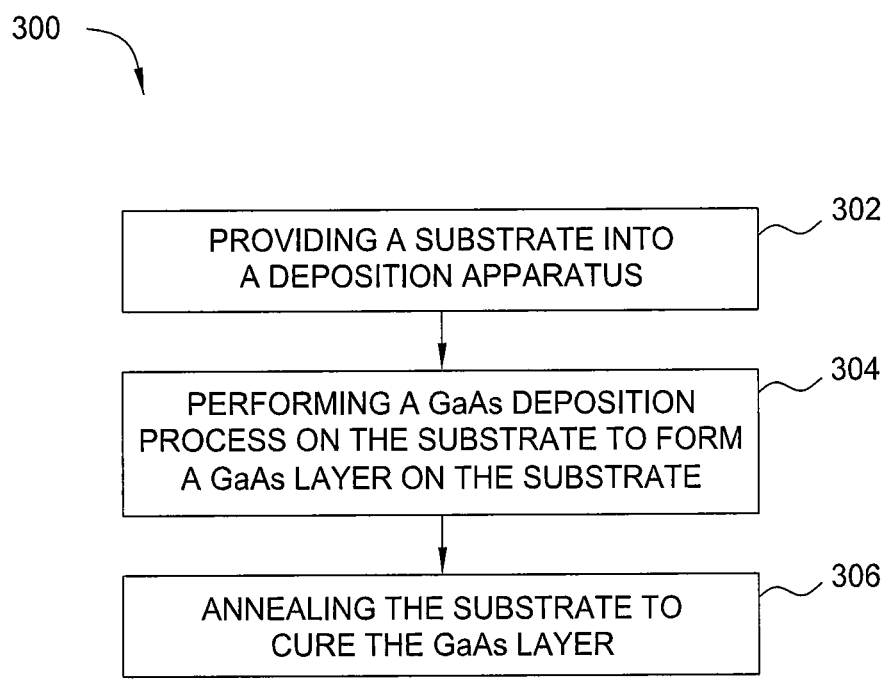
FIG. 3 is a flow chart of methods to manufacture a GaAs based solar cell according to embodiments of the invention.

FIG. 3 depicts a flow diagram of one embodiment of a processing sequence 300 for forming a solution based GaAs layer utilized in a solar cell devices, such as the GaAs layer 106, 204 formed in the solar cell devices 150, 200 depicted in FIGS. 1 and 2. In the embodiment wherein the p-type layers 104, 202 and the n-type layers 108, 206 are configured as GaAs based materials, these layers may also be manufactured by the processing sequence 300 as depicted in FIG. 3. It is noted that FIG. 3 only depicts the process of manufacturing intrinsic GaAs layer 106, 204 for illustration purpose, and is not intended to limiting the invention scope or certain types of the layers that may be manufactured. It should be noted that the number and sequence of steps illustrated in FIG. 3 are not intended to limiting as to the scope of the invention described herein, since one or more steps can be added, deleted and/or reordered were appropriate without deviating from the basic scope of the invention described herein.

The processing sequence 300 begins at step 302 by providing a substrate 100 configured to form solar cell devices thereon, as shown in FIG. 1. In one embodiment, the substrate 100 may be a transparent substrate, a plastic substrate, a silicon containing substrate, such as a single crystal silicon substrate, a multicrystalline silicon substrate, a glass substrate, a quartz substrate, or other suitable materials. Similar to the film layers formed in the solar cell device 150, the substrate 100 may have a first TCO layer 102 and a p-type layer 104 formed thereon. The next step in the processing sequence 200, or step 204, is then performed on the p-type layer 104 to form a GaAs layer, such as the GaAs layer 106 depicted in FIG. 1, on the p-type layer 104. It is noted that the substrate 100 may have different material layers formed thereon to facilitate forming the GaAs layer on the substrate 100.

At step 304, a GaAs deposition process is performed to deposit a GaAs layer 106 on the substrate 100. The GaAs deposition process is performed by providing a pre-engineered solution based GaAs precursor to a processing chamber as a source precursor to facilitate depositing the GaAs layer 106 on the substrate 100.

The pre-engineered solution based GaAs precursor comprises a mixture of gallium complex and arsenic complex in solution, forming a gallium-arsenic complex in the solution. In one embodiment, the gallium-arsenic complex formed in the pre-engineered solution based GaAs precursor generally has a GaAs dimer (—GaAs—), a GaAs tetramer (—Ga$_2$As$_2$—), or a GaAs hexamer (—Ga$_3$As$_3$—) structure, as shown below.

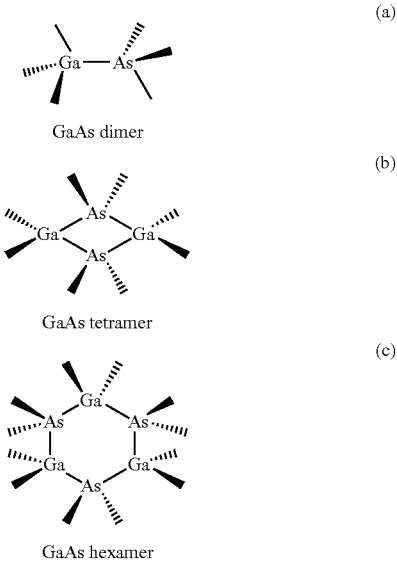

(a)

GaAs dimer (b)

GaAs tetramer (c)

GaAs hexamer

It is believed that GaAs dimer (—GaAs—), a GaAs tetramer (—Ga$_2$As$_2$—), or a GaAs hexamer (—Ga$_3$As$_3$—) structures are relatively stable complexes so make them as good candidates to be placed or stored in liquid solution under a relatively stable status. By utilizing this relatively stable solution based GaAs precursor, the GaAs solution may be delivered, injected, sprayed and coated onto the substrate with high uniformity and good film quality, thereby providing a reliable and repeatable GaAs layer with desired film properties and high film properties.

The GaAs dimer, GaAs tetramer, or GaAs hexamer may have different functional groups attached thereto to form the GaAs source precursor as a stable complex in the pre-engineered solution. The GaAs complex may have a formula Rdx(GaAs)$_y$R'$_z$, wherein x, y, and z are integers having a range between 1 and 15, which R and R' may or may not be the same function groups or the like. The functional groups that may be attached to the Ga and As elements in the GaAs dimer, GaAs tetramer, or GaAs hexamer may include alkyl group, such as methyl (CH$_3$—), ethyl (C$_2$H$_5$—), propyl (C$_3$H$_7$—), butyl (C$_4$H$_9$—), pentyl (C$_5$H$_{11}$—), and so on, isopropyl and other similar isomers, aromatic groups, such as benzyl, styrene, toluene, xylene, pyridine, ethylbenzene, acetophenone, methyl benzoate, phenyl acetate, phenol, cresol, furan, and the like, alicyclic group, such as cyclopropane, cyclobutane, cyclopentane, cyclopentadiene, toluene and the like, amino group, such as $NR_2$ (R as alkyl group), $-SiR_3$, $-O-R$, $-S-R$, $-PR_3$, $-POR_3$, halogens, 2,3,5,6-tetramethyl-1,4-benzoquinone or tetramethyl-p-benzoquinone, bidentate ligands, expedious ligands, amines pyranine, steric hindrance ligands and the like. In one exemplary embodiment, amino group, such as $NR_2$ (R as alkyl group) and steric hindrance ligands are selected as the functional groups attached to the GaAs dimer, GaAs tetramer, or GaAs hexamer.

The GaAs complex requires having a high solubility and stability in solution. Accordingly, the functional groups selected to form in the GaAs complex are desired to have 1:1 stoichiometry preactive or formed in clusters. Additionally, the functional groups are also desired to be able to be low temperature decomposed into GaAs. Furthermore, the bonding energy between the functional groups and Ga element and/or between the functional groups and As element is configured to be weaker than the bonding energy comprising the Ga—As bond. By this configuration, during a depositing reaction, the bonds between the functional groups and the Ga and/or As elements can be easily broken from the GaAs solution precursor, thereby assisting the formation of the GaAs layer on the substrate surface, and leaving GaAs bonding in the complex. As the functional groups as attached are selected to be easily removed, evaporated, or pyrolyzing during deposition or at the subsequent baking or curing process, a GaAs layer with minimum impurities or contamination may be thus obtained and formed on the substrate surface.

Suitable examples of the GaAs precursors that follows the requirements as stated above includes $(NMe_2)_2Ga_2As_2$ $(^tBuH)_2$, $Me_2GaAs(NMe_2)_2$, $Me_2GaAs(SiMePh_2)_2$, $Me_2GaAs(SiPh_3)_2$, $Et_2GaAs(SiMe_2Cy)_2$, $Me_2GaAs(SiMe_2Cy)_2$, $(Me)_3GaAs(NMe_2)_3$, $(Et)_3GaAs(NMe_2)_3$, $(Me)_4Ga_2As_2(^tBuH)_2$, $(Et)_4Ga_2As_2(^tBuH)_2$, 1:3 stoichiometry of Ga:As, such as $GaAs_3{}^tBu_6$, or the like. The structures of the GaAs precursors include the followings:

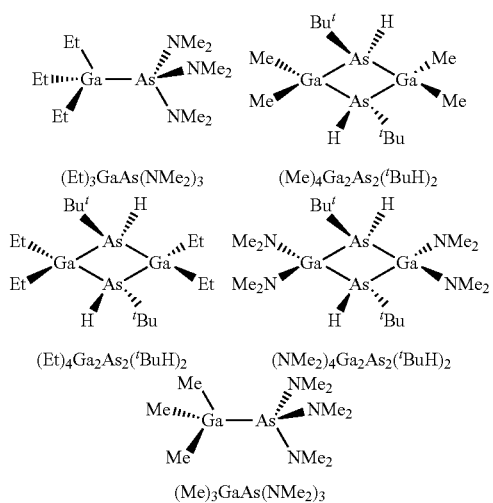

In one embodiment, the GaAs precursor used to form the GaAs layer 106, 204 on the substrate 100, as depicted in FIGS. 1 and 2, is $(NMe_2)_2GaAs^tBuH$. $(NMe_2)_2GaAs^tBuH$ precursor may be synthesized by mixing gallium amide (Ga $(NMe_2))_3$ with excess tert-butyl arsine ($^tBuAsH_2$) in hexane or toluene solvent or other suitable organic or inorganic solvent and stirring overnight, such as stirring over 16 hours. The process temperature may be controlled between about −40 degrees Celsius and about −90 degrees Celsius. After the mixing process, $(NMe_2)_2GaAs^tBuH$ is obtained and may be stored in $CH_2Cl_2$ solvent or toluene solvent.

In another embodiment, the GaAs layer may be formed by using tris(dimethylamino)arsine ($Me_6N_3As$) and trimethylgallium ($GaMe_3$) as source precursors to synthesize and pre-engineer the GaAs source precursor. The tris(dimethylamino)arsine ($Me_6N_3As$) and trimethylgallium ($GaMe_3$) are reacted in toluene or hexane solvent to form the desired solution based GaAs containing precursor. The process temperature may be controlled between about −40 degrees Celsius and about −90 degrees Celsius.

In yet another embodiment, the GaAs layer may be formed by using $[\{L\}HGaAsR]_n$ or $[\{L\}_2GaAs^tBuH]$ as a precursor, in which L is nitrogen-based donor ligand, $NMe_2$, or hydrazines functional groups. The precursors of $[\{L\}HGaAsR]_n$ or $[\{L\}_2GaAs^tBuH]$ may be synthesized by a reaction of $As(SiR_3)_3$, $R_3SiAsH_3$, or $H_2As^tBu$ with $GaH_3\{L\}$ or $Ga\{L\}_3$ in a hexane solution while stirring at room temperature for over 24 hours. After the reaction is completed, the $[\{L\}HGaAsR]_n$ or $[\{L\}_2GaAs^tBuH]$ precursor may be obtained and can be used as a source of GaAs to form the GaAs layer on the substrate when decomposed.

The GaAs containing precursor, such as $(NMe_2)_2GaAs^tBuH$, $[\{L\}HGaAsR]_n$ or $[\{L\}_2GaAs^tBuH]$, or other suitable precursor as described above, is then supplied to a CVD chamber to deposit the GaAs layer on the substrate. In one embodiment, the solution based GaAs containing precursor is supplied in a CVD chamber to perform an aerosol assisted chemical vapor deposition (AACVD) process. In the AACVD process, the GaAs containing precursor is dissolved An example of the AACVD chamber that may be used to practice the present invention will be further discussed below with referenced to FIG. 4. The precursor solution is atomized by using an aerosol generator. A carrier gas is used to promote aerosol formation. Subsequently, aerosol carrying the GaAs containing solvent precursor is transported into CVD chamber by the carrier gas and evaporated in the chamber. After entering into the CVD chamber, the precursor enters into the gas phase from the liquid phase to enable the CVD process. Subsequently, the gas phase GaAs containing precursor is then decomposed and absorbed on the substrate to form the desired GaAs layer on the substrate. If the precursor does not get full vaporization, spray pyrolysis process will take place to have the precursor become as aerosol droplets to be absorbed on the substrate and form the GaAs layer on the substrate surface. In one embodiment, during the AACVD deposition process, the substrate temperature is controlled at about 550 degrees Celsius so as to efficiently evaporate the precursor entering into the chamber.

In another embodiment, the GaAs layer may also be formed on the substrate by using aerojet, flash evaporation, laser assisted CVD, UV assisted CVD, laser reactive deposition, nanoparticles spray from solution, spray CVD, metalorganic vapour phase epitaxy (MOVPE), hydride vapor phase epitaxy (HVPE), or by other suitable techniques as needed. Some other wet deposition process, such as ink-jet, spin coating, meniscus coating, dip coating, electroplating, spray coating, electrospraying, screen printing or other suitable techniques may also employed to form the GaAs layer on the substrate surface. Furthermore, some vacuum techniques, such as molecular beam epitaxy (MBE), metalorganic vapour phase epitaxy (MOVPE), pulsed laser deposition (PLD), plasma enhanced chemical vapor deposition (PECVD), sputter, evaporate, magnetron sputter, chemical beam deposition, atomic layer deposition (ALD), hardware chemical vapor deposition (HWCVD), microwave plasma and some other techniques, may also used as needed.

After deposition, the GaAs layer 106, 204, is formed on the substrate 100, as shown in FIGS. 1 and 2. The GaAs layer as formed on the substrate may have a ratio of Ga element to As element substantially between about 1:0.8 and about 1:1.2. XRD analysis indicates that the GaAs layer as formed has a strong (111) plane peak. The XRD peak positions, at <111>, <220> and <311> planes, match with the standard peak positions for cubic GaAs. In one embodiment, the GaAs layer 106 may have a thickness between about 0.2 μm and about 3 μm.

In one embodiment, different dopants may be doped into the GaAs layer. Dopants may be in form of particles, powders, gel, liquid, solution or any other suitable forms, blending and mixing into the solution based GaAs pre-engineered precursor. Different dopants formed in the GaAs layer may provide different film conductivity and mobility, thereby increasing the electrical performance of the devices. In one embodiment, the dopants that may be doped into the GaAs layer include Al, Zn, Mg, In, P, Si, Se, S, C, N and the like.

At step 306, after the GaAs layer 106, 204 is formed on the substrate 100, an anneal process is performed to thermally process the GaAs layer 106, 204. It is noted that different types of post treatment processes, such as quenching, baking, laser treatment, or the like, may also be performed on the GaAs layer 106, 204 as needed. As the precursor utilized to form the GaAs layer 106 contains elements other than Ga and As, such as carbon, nitrogen, oxide, or other elements contained in the precursor. The thermal annealing process and/or the post treatment process performed on the deposited layer may assist in the driving out of the impurities contained in the as-deposited GaAs layer 106, 204. The thermal process may also assist in the repair of defects that may be formed in the as-deposited film during the deposition process.

In one embodiment, the annealing process may be performed by any suitable annealing tool, such as furnace, rapid thermal processing (RTP) chamber, spike anneal, or laser annealing chamber, and the like. The annealing process may be performed at a temperature between about 400 degrees Celsius and about 600 degree Celsius to assist in the densification and/or crystallization of the GaAs layer 106, 204 formed on the substrate 100.

Figure 4:
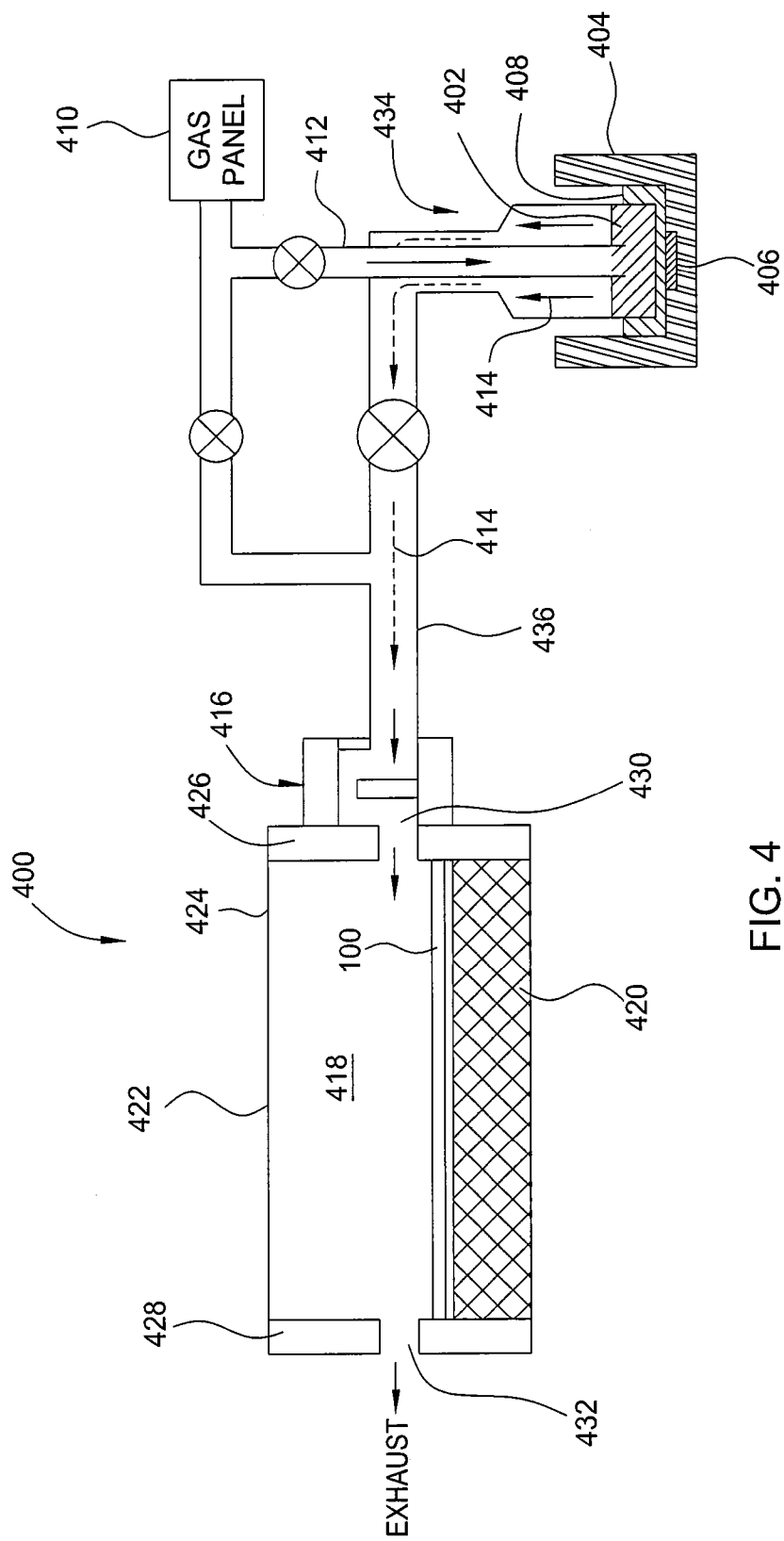
FIG. 4 depicts a simplified sectional perspective view of one embodiment of an aerosol assisted chemical vapor deposition (AACVD)

FIG. 4 depicts a simplified sectional perspective view of one embodiment of an aerosol assisted chemical vapor deposition (AACVD) chamber 300 that may be utilized to deposit a solution based GaAs layer on a substrate, such as the substrate 100 described above with referenced to FIGS. 1-2. The AACVD chamber 400 may be used to perform a AACVD deposition process, such as the deposition process described above with referenced to FIGS. 1-2. It is noted that other types of deposition process, such as MOCVD, aerojet, flash evaporation, laser assisted CVD, UV assisted CVD, laser reactive deposition, nanoparticles spray from solution, spray CVD, MOVPE, HVPE, or by other suitable techniques may be used to form the GaAs layer as needed. Some other wet deposition process, such as ink-jet, spin coating, meniscus coating, dip coating, electroplating, spray coating, electrospraying, screen printing or other suitable techniques may also employed to form the GaAs based layer on the substrate surface. Furthermore, some vacuum techniques, such as MBE, MOVPE, PLD, PECVD, sputter, evaporate, magnetron sputter, chemical beam deposition, ALD, HWCVD, microwave plasma and some other techniques, may also used as needed.

The chamber 400 includes a reaction tube 422 having a first wall 426, a second wall 428, and a reactor body 424 connecting between the first wall 326 and the second wall 428. The first wall 426, the second wall 428, and the reactor body 424 formed in the reaction tube 422 defines an interior processing region 418. A graphite heating block 420 is disposed in the reaction tube 422 to receive the substrate 100 disposed thereon for processing. The temperature of the substrate 100 may be monitored by a temperature sensor (not shown) disposed in the reaction tube 422 as needed.

An exhaust port 432 is formed in the second wall 428 to facilitate transferring the substrate 100 into and out of the reaction tube 422. A gas inlet port 430 is formed in the first wall 426 to facilitate delivering reaction gases and precursors into the interior processing region 418 during process from a mixing chamber 416. A liquid ampoule container 434 is attached to the mixing chamber 416 through a gas delivery passageway 436. The liquid ampoule container 434 may store precursors 408 to provide source materials into the interior processing region 418 to deposit a GaAs based layer based on the substrate 100. The mixing chamber 416 provides a tortuous path which may extend the flow path for the GaAs precursor 408 supplied from the liquid ampoule container 434 to ensure thorough mixing. Examples of GaAs precursor may be stored in the liquid ampoule container 434 include $(NMe_2)_2GaAs^tBuH$, $Me_2GaAs(NMe_2)_2$, $Me_2GaAs(SiMePh_2)_2$, $Me_2GaAs(SiPh_3)_2$, $Et_2GaAs(SiMe_2Cy)_2$, $Me_2GaAs(SiMe_2Cy)_2$, $(Me)_3GaAs(NMe_2)_3$, $(Et)_3GaAs(NMe_2)_3$, $(Me)_4Ga_2As_2(^tBuH)_2$, $(Et)_4Ga_2As_2(^tBuH)_2$, or the like.

In the embodiment wherein a doped GaAs based layer is desired to be formed on the substrate 100, such as a p-type doped GaAs based layer or a n-type doped GaAs based layer, dopant containing materials may be blended, added or mixed with the GaAs precursor in the liquid ampoule container 334, forming a dopant containing GaAs precursor which can be readily supplied to the interior processing region 418 for processing. As discussed above, suitable p-type dopant materials that may be added into the GaAs precursor include zinc containing materials, such as metallic zinc dopants, dimethyl zinc (DMZ), diethyl zinc (DEZ), or the like, magnesium containing material, such as metallic magnesium dopants, cyclopentadienyl magnesium, or the like, and carbon containing materials, such as carbon chlorine ($CCl_4$), carbon bromide ($CBr_4$) or the like. Suitable n-type dopant materials that may be added into the GaAs precursor include sulfur containing materials, such as $H_2S$, sulfur, silicon containing materials such as silane ($SiH_4$), disilane ($Si_2H_6$), and selenium containing material, such as $H_2Se$, Se or the like. In one embodiment, the p-type dopant materials utilized to be added to the GaAs precursor is DMZ or DEZ and n-type dopant materials utilized to be added to the GaAs precursor is disilane ($Si_2H_6$).

A gas panel 410 is coupled to the liquid ampoule container 432 to supply a carrier gas to the liquid ampoule container 432 through a delivery passageway 412. The gas panel 410 introduces carrier gases to the liquid ampoule container 434 to inject and push the GaAs precursor 402 disposed in the liquid ampoule container 434 to the mixing chamber 416 and ultimately into the interior processing region 418 through the gas delivery passageway 436. Examples of gases that may be supplied from the gas panel 410 include nitrogen containing gas, such as nitrogen ($N_2$), $N_2O$, and NO, among others, or oxygen containing gas, such as, oxygen ($O_2$) or ($O_3$). Inert gas, such as Ar or He, may also be used to carry the GaAs precursor 402 into the interior processing region 418. In one exemplary embodiment described herein, the carrier gas used to inject and push the GaAs precursor 408 to the interior processing region 418 is nitrogen ($N_2$) gas.

The solution based GaAs precursor with/without the desired dopants 402 disposed in the liquid ampoule container 434 is heated and vaporized by a humidifier 404. The humidifier 404 may have a piezoelectric device 406 which may provide ultrasonic energy and/or heat energy to the solution based GaAs precursor 402 disposed therein, thereby assisting heating and evaporating GaAs precursor 402 into gas phase or in form of tiny droplets for injection into the interior processing region 418 by the carrier gas, as shown by the arrow 414. Some liquid 408, such as water or other suitable liquid, may be disposed between the liquid ampoule container 434 and the humidifier to maintain the solution based GaAs precursor 402 within a desired temperature range. In one embodiment, the humidifier 404 may vaporize the GaAs precursor at a temperature between about 100 degrees Celsius and about 250 degrees Celsius.

Figure 5:
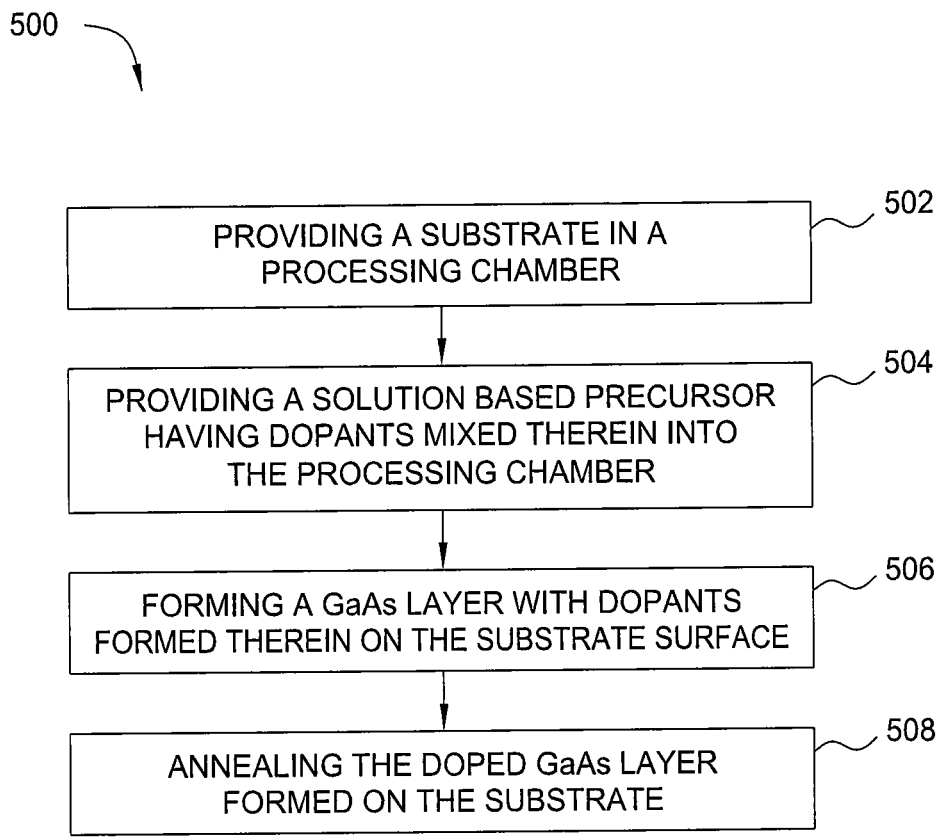
FIG. 5 is a flow chart of methods to manufacture a GaAs based solar cell according to another embodiment of the invention.

FIG. 5 depicts a flow diagram of another embodiment of a processing sequence 500 for forming a solution based GaAs based layer, which may be formed as the intrinsic GaAs layer 106, 204 and be incorporated into a solar cell devices, in the embodiment wherein the p-type layer 104, 202 is configured to be the p-type doped GaAs based layer 104, 202 and n-type layer 108, 206 is configured to be the n-type doped GaAs based layer 108, 206 formed in the solar cell devices 150, 200 depicted in FIGS. 1 and 2. It should be noted that the number and sequence of steps illustrated in FIG. 5 are not intended to limiting as to the scope of the invention described herein, since one or more steps can be added, deleted and/or reordered were appropriate without deviating from the basic scope of the invention described herein.

The processing sequence 500 begins at step 502 by providing a substrate 100 configured to form solar cell devices thereon, as shown in FIGS. 1-2. In one embodiment, the substrate 100 may be a transparent substrate, a plastic substrate, a silicon containing substrate, such as a single crystal silicon substrate, a multicrystalline silicon substrate, a glass substrate, a quartz substrate, or other suitable materials. Similar to the film layers formed in the solar cell device 150, the substrate 100 may have a first TCO layer 102 formed thereon. The next step in the processing sequence 500, or step 504, is then performed on the substrate to form a p-type doped GaAs layer, an intrinsic GaAs layer, or a n-type doped GaAs layer, as needed. It is noted that the substrate 100 may have different material layers formed thereon to facilitate forming the GaAs layer on the substrate 100.

At step 504, a GaAs precursor having desired dopants mixed, blended, added therein, is supplied to a processing chamber, such as the processing chamber 400 depicted in FIG. 4. The GaAs precursor may be a pre-engineered solution based GaAs precursor, as discussed above, having desired dopants, such as p-type dopants or n-type dopants, added therein, as a source precursor to facilitate depositing the p-type GaAs doped based layer or n-type doped GaAs based layer on the substrate 100. In the embodiment wherein an intrinsic type GaAs layer is desired to be formed, dopants are not necessary to be added into the GaAs precursor.

The pre-engineered solution based GaAs precursor comprises a mixture of gallium complex and arsenic complex in solution, forming a gallium-arsenic complex in the solution. In one embodiment, the gallium-arsenic complex formed in the pre-engineered solution based GaAs precursor generally has a GaAs dimer (—GaAs—), a GaAs tetramer (—$Ga_2As_2$—), or a GaAs hexamer (—$Ga_3As_3$—) structure. It is believed that GaAs dimer (—GaAs—), a GaAs tetramer (—$Ga_2As_2$—), or a GaAs hexamer (—$Ga_3As_3$—) structures are relatively stable complexes, making them suitable to be placed or stored in liquid solution. By utilizing this relatively stable solution based GaAs precursor, the GaAs solution may be delivered to the substrate with high uniformity to produce a predictable good film quality, thereby providing a reliable and repeatable GaAs layer with desired film properties and high film properties.

The GaAs dimer, GaAs tetramer, or GaAs hexamer may have different functional groups attached thereto when used to form the GaAs source precursor as a stable complex in the pre-engineered solution. The GaAs complex may have a formula $R_x(GaAs)_yR'_z$, wherein x, y, and z are integers having a range between 1 and 15, which R and R' may or may not be the same function groups or the like. The functional groups that may be attached to the Ga and As elements in the GaAs dimer, GaAs tetramer, or GaAs hexamer may include alkyl group, such as methyl ($CH_3$—), ethyl ($C_2H_5$—), propyl ($C_3H_7$—), butyl ($C_4H_9$—), pentyl ($C_5H_{11}$—), and so on, isopropyl and other similar isomers, aromatic groups, such as benzal, styrene, toluene, xylene, pyridine, ethylbenzene, acetophenone, methyl benzoate, phenyl acetate, phenol, cresol, furan, and the like, alicyclic group, such as cyclopropane, cyclobutane, cyclopentane, cyclopentadiene, toluene and the like, amino group, such as $NR_2$ (R as alkyl group), —$SiR_3$, —O—R, —S—R, —$PR_3$, —$POR_3$, halogens, 2,3,5,6-tetramethyl-1,4-benzoquinone or tetramethyl-p-benzoquinone, bidentate ligands, expedious ligands, amines pyranine, steric hindrance ligands and the like. In one exemplary embodiment, amino group, such as $NR_2$ (R as alkyl group) and steric hindrance ligands are selected as the functional groups attached to the GaAs dimer, GaAs tetramer, or GaAs hexamer. Suitable examples of the GaAs precursors that follows the requirements as stated above includes $(NMe_2)_2Ga_2As_2(^tBuH)_2$, $Me_2GaAs(NMe_2)_2$, $Me_2GaAs(SiMePh_2)_2$, $Me_2GaAs(SiPh_3)_2$, $Et_2GaAs(SiMe_2Cy)_2$, $Me_2GaAs(SiMe_2Cy)_2$, $(Me)_3GaAs(NMe_2)_3$, $(Et)_3GaAs(NMe_2)_3$, $(Me)_4Ga_2As_2(^tBuH)_2$, $(Et)_4Ga_2As_2(^tBuH)_2$, 1:3 stoichiometry of Ga:As, such as $GaAs_3{}^tBu_6$, or the like. In one embodiment, the GaAs precursor selected to form the p-type doped GaAs layer, intrinsic type GaAs layer or n-type doped GaAs layer is $(NMe_2)_2GaAs^tBuH$. $(NMe_2)_2GaAs^tBuH$ precursor may be synthesized by mixing gallium amide $(Ga(NMe_2))_3$ with excess tert-butyl arsine ($^tBuAsH_2$) in hexane or toluenene solvent or other suitable organic or inorganic solvent and stirring overnight, such as stirring over 16 hours. The process temperature may be controlled between about −40 degrees Celsius and about −90 degrees Celsius. After the mixing process, $(NMe_2)_2GaAs^tBuH$ is obtained and may be stored in a $CH_2Cl_2$ solvent or a toluene solvent.

Suitable p-type and n-type dopants as described above may added, mixed or blended into the GaAs precursor to form a doped GaAs solution based precursor to form the p-type or n-type doped GaAs layers. Suitable examples of p-type dopants may be added into the GaAs precursor include metallic zinc dopants, dimethyl zinc (DMZ), diethyl zinc (DEZ), metallic magnesium dopants, cyclopentadienyl magnesium, carbon chlorine ($CCl_4$), carbon bromide ($CBr_4$) or the like. Suitable examples of n-type dopants include $H_2S$, sulfur, silane ($SiH_4$), disilane ($Si_2H_6$), $H_2Se$, Se or the like.

At step 506, after the GaAs precursor with/without dopants is supplied into the processing chamber, a doped/undoped GaAs layer may be formed on the substrate surface. In one embodiment, the solution based GaAs containing precursor is supplied in a CVD chamber, such as the AACVD chamber 400 depicted in FIG. 4, to perform an aerosol assisted chemical vapor deposition (AACVD) process. As discussed above, dopants may also be in form of particles, powders, gel, liquid, solution or other suitable form and may be mixed into the solution based GaAs pre-engineered precursor. Different dopants selected to form the doped GaAs layer may provide different film conductivity and mobility, thereby increasing the electrical performance of the devices. In one embodiment, the dopants that may be doped into the GaAs layer include Al, Zn, Mg, In, P, Si, Se, S, C, N and the like.

In one embodiment, the dopant concentration in the doped GaAs layer may be controlled at between about $1\times10^{16}$ atom/cm$^3$ and about $1\times10^{20}$ atom/cm$^3$. For example, in a p-type doped GaAs layer, the p-type dopants may be doped in the GaAs layer with a dopant concentration between about $1\times10^{17}$ atom/cm$^3$ and about $1\times10^{19}$ atom/cm$^3$. In another example, in a n-type doped GaAs layer, the n-type dopants may be doped in the GaAs layer with a dopant concentration between about $1\times10^{18}$ atom/cm$^3$ and about $1\times10^{20}$ atom/cm$^3$.

At step 508, after the doped/undoped GaAs layer is formed on the substrate 100, an anneal process is performed to thermally process the deposited GaAs layer. It is noted that different types of post treatment processes, such as quenching, baking, laser treatment, or the like, may also be performed on the deposited GaAs layer as needed. The precursor utilized to form the GaAs layer contains elements other than the dopants, Ga and As, such as carbon, nitrogen, oxide, or other impurities which may become entrained in the deposited GaAs film. The thermal annealing process and/or the post treatment process performed on the deposited layer may assist in the driving out of the impurities contained in the as-deposited GaAs layer. The thermal process may also assist in the repair of defects that may be present in the as-deposited film during the deposition process.

In one embodiment, the annealing process may be performed by any suitable annealing tool, such as furnace, rapid thermal anneal (RTP) chamber, spike anneal, or laser annealing chamber, and the like. The annealing process may be performed at a temperature between about 400 degrees Celsius and about 600 degree Celsius to assist in the densification and/or crystallization of the GaAs layer formed on the substrate 100. An example of a thermal annealing chamber, such as a RTP chamber, will be further discussed above with referenced to FIG. 6.

Figure 6:
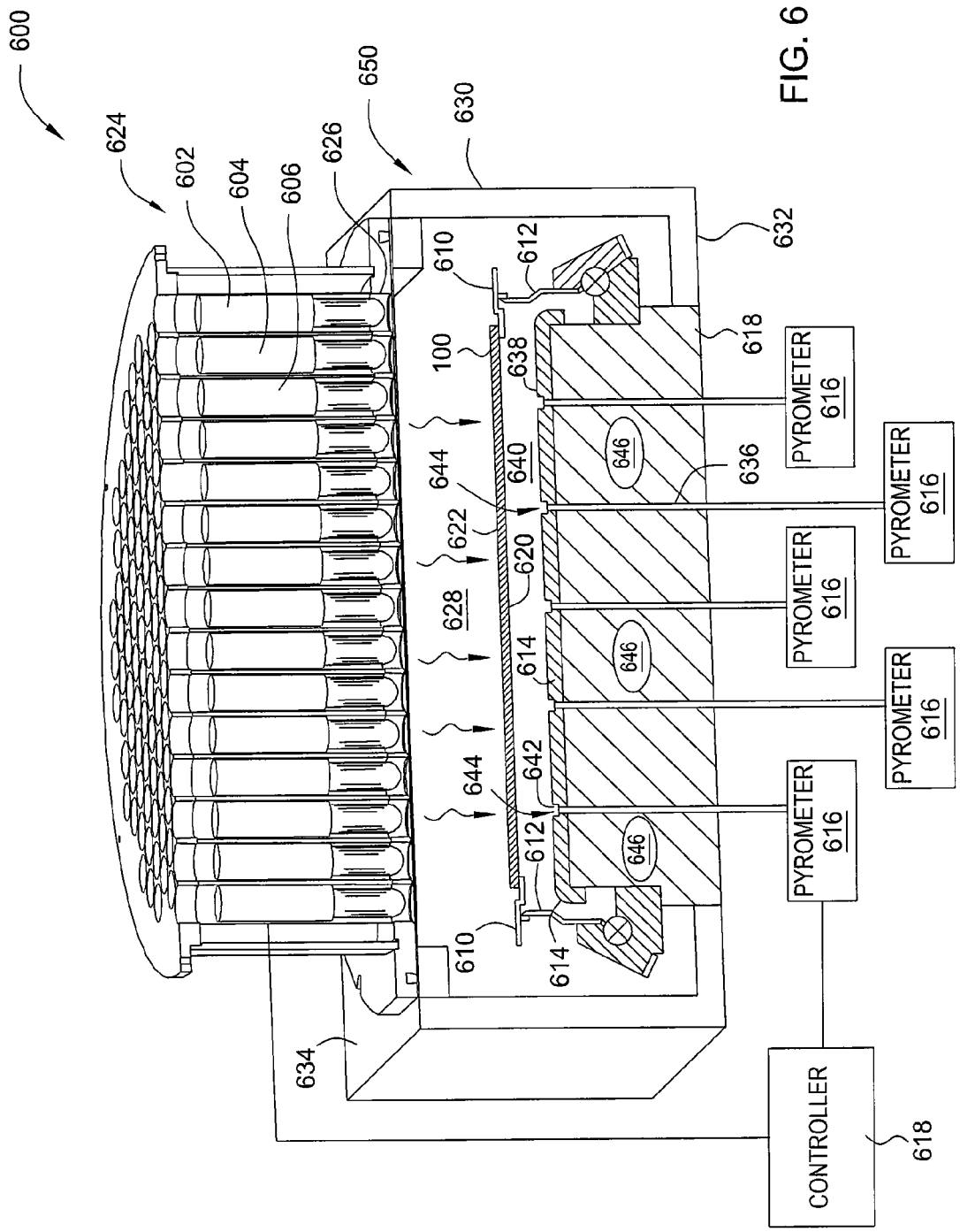
FIG. 6 depicts a simplified sectional perspective view of one embodiment of a rapid thermal processing chamber.

FIG. 6 depicts a simplified sectional perspective view of one embodiment of a rapid thermal processing chamber 600 that may be utilized to anneal a substrate, such as the substrate 100 described above with referenced to FIGS. 1-5. The processing chamber 600 includes a chamber body 650 having chamber walls 630, a bottom 632, and a top 634 defining an interior volume 628. The walls 630 typically include at least one substrate access port (not shown) to facilitate entry and egress of the substrate 100.

A radiant heat assembly 624 is mounted to the top 634 of the chamber body 650. The radiant heat assembly 624 is utilized to heat the substrate 100 suspended by an edge ring 610 disposed around the periphery of the substrate 100. The radiant heat assembly 624 includes a plurality of lamp tubes 602 in a water jacket assembly 604. Each tube 602 contains a reflector and a tungsten halogen lamp assembly. The lamp tubes 602 are nested in a tight honeycomb pipe arrangement. This close-packed hexagonal arrangement of lamp tubes 602 provides radiant energy, such as an IR radiation and/or longer wavelength of UV radiation having a wavelength between about 400 nm and about 4000 nm with high-power density. In one embodiment, the radiant heat assembly 624 provides radiant energy to thermally process the substrate, such as annealing a silicon layer disposed on the substrate 100. One radiant heat assembly 624 that may be adapted to benefit from the invention is described in U.S. Pat. No. 5,487,127, issued Jan. 23, 1996 to Gronet, et al., and is hereby incorporated by reference in its entirety.

The edge ring 610 that supports substrate 100 is spaced above a stainless steel base 618 by a rotatable quartz cylinder 612 mounted on a stainless steel base 618. The edge ring 610 may be fabricated from a hard material with a small coefficient of thermal expansion, such as silicon carbide, to prevent excessive expansion and contraction during thermal processing. The quartz cylinder 612 is rotated between about 50 rpm and about 300 rpm during substrate processing to maximize substrate temperature uniformity by minimizing the effect of thermal asymmetries in the chamber 600 and on the substrate 100. In one embodiment, the cylinder 612 may be coated with silicon to render the cylinder opaque to a desired wavelength. The base 618 has a circulation circuit 646 allowing coolant, such as water, to circulate therethrough. The coolant circulation efficiently cools down the chamber temperature after processing.

A reflector plate 614 is disposed below the substrate 100 and mounted above the base 618. An array of temperature probes 644 is embedded in the reflector plate 614 through openings 642 defined therein. The temperature probes 644 are connected to pyrometers 616 through a conduit 636 that extends from the bottom side of the base 618 to the openings 642 in the reflector plate 614. The temperature probes 644 and pyrometers 616 are used to obtain a metric indicative of temperatures of regions of the substrate 100 proximate each probe 644 such that a temperature gradient of the substrate may be determined.

The bottom side 620 of the substrate 100 and the upper side 538 of the reflector plate 614 bound a reflecting cavity 640 therebetween. The reflecting cavity 640 enhances the effective emissivity of the substrate 100, thereby improving the accuracy of the temperature measurement. A controller 618 may receive measurements from the pyrometers 616 and output control signals to radiant heat assembly 624 for real-time modify the radiation generated in the processing chamber 600, thereby maintaining the substrate temperature within a desired processing range.

The upper side 638 of the reflector plate 614 is highly reflective, and reflects thermal radiation in a target wavelength range and absorbs thermal radiation other then the target wavelength range. One or more coating or layers may be utilized to coat the reflector plate 614 on the base 618 to provide the selective reflectivity. For example, different combination of coatings with different reflectivity and absorbability may be utilized to enable the reflector plate 614 to reflect thermal radiation at a desired wavelength back to the substrate 100 and absorb (or less reflect) thermal radiation other than the desired wavelength. In one embodiment, the reflector plate 614 reflects the thermal wavelength between about 700 nm and about 1000 nm, and absorbs thermal wavelength below 700 nm and above 1000 nm. One reflector plate 614 that may be adapted to benefit from the invention is described in U.S. Pat. No. 6,839,507, issued Jan. 4, 2005 to Adams, et al., and is hereby incorporated by reference in its entirety.

The thermal energy not reflected to back to the substrate 100 is absorbed by the reflector plate 614. The absorbed thermal energy is efficiently and rapidly removed by the coolant circulating through the base 618 disposed below the reflector plate 614. Additionally, gas provided through holes (not shown) in the reflector plate 614 may be utilized to promote the cooling rate of the reflector plate 614 and the substrate 100 positioned thereabove. The rapid cool down rate provided by the reflector plate 614 promotes the temperature control of the substrate 100, thereby efficiently providing a desired temperature processing profile. In one embodiment, the reflector plate 614 may provide a substrate cool date rate greater than about 200 degrees Celsius per second. In another embodiment, the reflector plate 614 may provide a substrate cool down rate of about 220 degrees Celsius per second.

Figure 7:
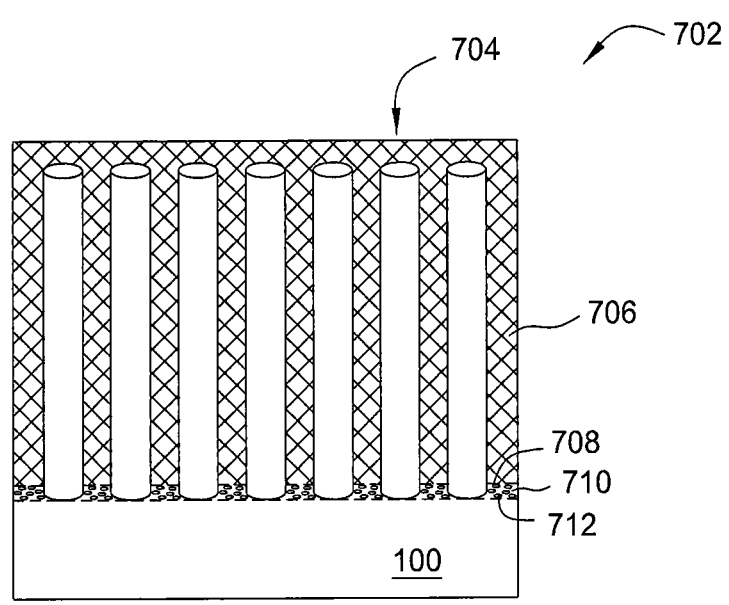
FIG. 7 depicts a cross sectional view of carbon nano-tubes formed in a GaAs based material according to one embodiment of the invention.

FIG. 7 is a cross sectional view of a light absorber layer 702 comprising a plurality of carbon nano-tubes (CNTs) 704 surrounded by GaAs materials 706 in accordance with one embodiment of the present invention. It is noted that FIG. 7 illustrates one possible configuration of a light absorber layer 702 having carbon nano-tubes (CNTs) 704 that are formed and encapsulated by the GaAs materials 706. In some other configurations, additional layers may be formed between the substrate and the light absorber layer 702, or between the substrate 100 and the carbon nano-tubes (CNTs) 704, prior to disposing the GaAs materials 706 over the carbon nano-tubes (CNTs) 704. Examples of solar cell devices that utilize carbon nano-tubes (CNTs) 704 coated with the GaAs materials 706 are discussed below with reference to FIGS. 8 and 9.

Continuing to refer to FIG. 7, in one embodiment, the light absorber layer 702 is formed on a surface 708 of the substrate 100. The light absorber layer 702 is used to assist in the process of trapping light and the generation of current in the solar cell device. It is believed that the carbon nano-tubes (CNTs) 704 disposed in the light absorber layer 702 can be used as an efficient pathway for improving the collection of holes and/or electrons and reduce the charge carrier recombination rate that typically can occur in conventional light absorber layers. The carbon nano-tubes (CNTs) 704 have desirable electrical properties that may improve the charge generation in the formed solar cell device. In one embodiment, the carbon nano-tubes (CNTs) 704 are formed on the surface of the substrate. Subsequently, the solution based GaAs layer 706 is deposited over the carbon nano-tubes (CNTs) 704, thus encapsulating the carbon nano-tubes (CNTs) 704. It is noted that additional layers may also be deposited over the carbon nano-tubes (CNTs) 704 prior to disposing the GaAs layer 306 over the carbon nano-tubes (CNTs) 704.

In one embodiment, the light absorber layer 702 is formed as a continuous thin film on the surface of the substrate 100. The GaAs containing light absorber layer 702 provides a high light absorption coefficient across a wide spectrum extending from the ultraviolet (UV) wavelengths through the near infrared (IR) wavelengths. The formed light absorber layer 702 will also have a high electrical conductivity measured through the continuous thin film 702, due to the incorporation of the CNTs in the layer. Furthermore, due to the high light absorption coefficient of the formed absorber layer 702, the overall thickness of the absorber layer can be reduced, which provides enhanced solar cell characteristics, such as cell energy conversion efficiency, open circuit voltage, fill factor and normalized short circuit current.

In one embodiment, the carbon nano-tubes (CNTs) 704 are nanometer scale cylinders with walls formed of graphene— single atom thick sheets of graphite. The carbon nano-tubes 704 may be either single walled (cylinder wall composed of a single sheet of graphene, referred to as SWNTs) or multi-walled (cylinder wall composed of multiple sheets of graphene, referred to as MWNTs). In one embodiment, a thin layer 710 of metallic particle catalyst 712 may be deposited on the substrate 100 prior to formation of the carbon nano-tubes (CNTs) 704. The thin layer 710 of metallic particle catalyst 712 can be used to promote the nucleation of the carbon atoms on the substrate 100, thereby promoting the subsequent deposition of the carbon nano-tubes (CNTs) 704 on the substrate 100. In one configuration, the carbon nano-tubes (CNTs) 704 are selectively formed on the metal particle catalyst 712 using a hydrocarbon precursor gases, such as ethylene, propylene, acetylene, benzene, toluene, ethane, methane, butane, propane, hexane, methanol, ethanol, propanol, isopropanol, carbon monoxide, acetone, oxygenated hydrocarbons, low-molecular-weight hydrocarbons, high-molecular weight hydrocarbons or combinations thereof. Suitable metal particles include iron, nickel, cobalt, copper, molybdenum and alloys, or the like. The thin layer 710 may be a metallic material selected from Fe, Cu, Al, Co, Mo, Ta, W, Ag, Ni, $Al_2O_3$ or the like.

In one embodiment, the carbon nano-tubes (CNTs) 704 are vertically aligned on the substrate 100 with regular spacing between the individual carbon nano-tubes (CNTs) 704. Vertical alignment of the carbon nano-tubes (CNTs) 704 may assist trapping light within the light absorber layer 702. The length of carbon nano-tubes (CNTs) 704 may be about 100 nm to about 2.0 μm along with a diameter ranging from about 0.5 to about 1.5 nm. In a configuration where the carbon nano-tubes (CNTs) 704 are surrounded with the GaAs materials 706, the GaAs material 706 may be formed over the carbon nano-tubes (CNTs) 704 using a process similar to the process as described above with reference to FIGS. 3 and 5. In one embodiment, the height of the formed carbon nano-tubes (CNTs) 704, off the surface 708 of the substrate, is between about 5 and 95 percent of the thickness of the light absorber layer 702.

The carbon nano-tubes (CNTs) 704 may be aligned vertically and parallel to each other. Such an alignment provides a shorter pathway for carrier extraction (e.g., hole) from the light absorber layer 702 via conduction through the carbon nano-tubes (CNTs) 704 material. The desired density of the formed carbon nano-tubes (CNTs) 704 in the light absorber layer 702 may be a compromise between efficiency of electron-hole pair production within the light absorber layer 702 and the efficiency of the hole extraction from the light absorber layer 702. In one embodiment, the desired average density of carbon nano-tubes (CNTs) 704 on the surface of the substrate may be on the order of $10^{11}$ to $10^{16}$ per square meter.

In one embodiment, the metallic thin layer 710 formed on the substrate 100 may be an aluminum with Fe nano-particles 710 formed thereon. The diameter of the Fe nano-particles will determine the diameter of the carbon nano-tubes (CNTs) 704 subsequently formed thereon. The nano-particles 710 and the thin layer 712 may be formed by any suitable techniques, such as CVD, PVD, ALD, PECVD, HWCVD, any plasma process or UV induced ALD techniques. The carbon nano-tubes (CNTs) 704 are then formed on the Fe nano-particles 710. Once the carbon nano-tubes (CNTs) 704 are grown on the substrate 100, the GaAs based material 306 is then disposed over the carbon nano-tubes (CNTs) 704 to form the light absorber layer 702.

Figure 8:
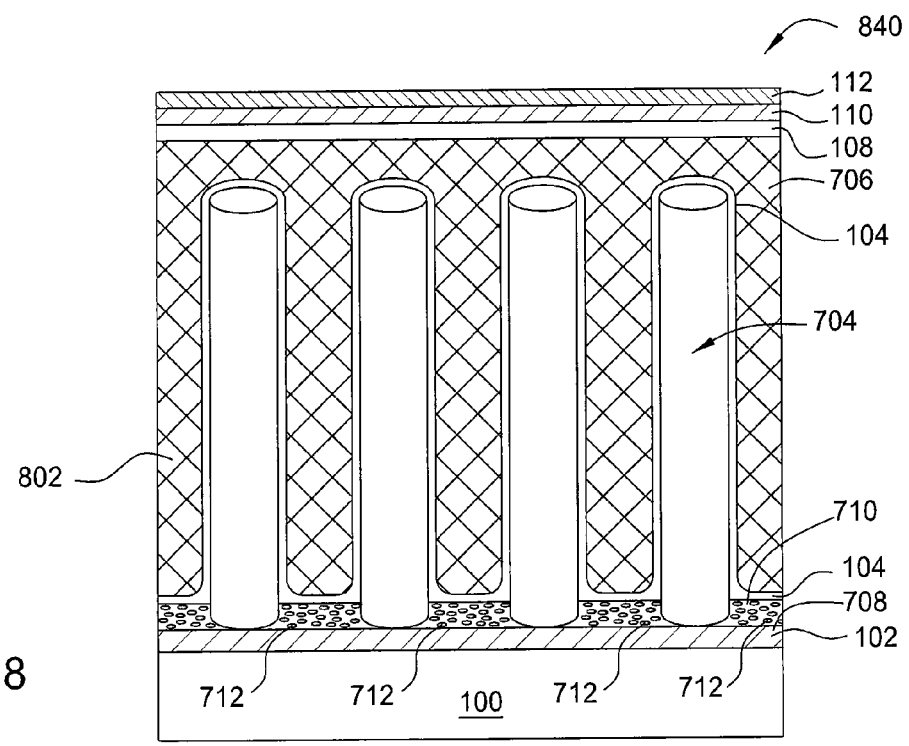
FIG. 8 depicts a cross sectional view of a solar cell device in accordance with one embodiment of the present invention.

FIG. 8 is a cross sectional view of an alternate type of solar cell device 840 having a light absorber layer 802 formed in a solar cell device 840, which is generally configured similarly to the light absorber layer 106 disposed within the solar cell device 150 depicted in FIG. 1. In this configuration, the light absorber layer 802 comprises a GaAs material 706 disposed over a plurality of carbon nano-tubes (CNTs) 704. In this embodiment, as discussed above, a first TCO layer 102 is formed on the substrate 100. Subsequently, the carbon nano-tubes (CNTs) 704 are formed on the first TCO layer 102. As discussed above with referenced to FIG. 7, the optional catalyst particles 712 may be formed on the substrate 100 to assist the growth of the carbon nano-tubes (CNTs) 704 thereon. After forming the carbon nano-tubes (CNTs) 704 on the substrate 100, a p-type layer 104 is formed over the carbon nano-tubes (CNTs) 704, using the processes described above with referenced to FIGS. 3 and 5. In one embodiment, the p-type layer 104 forms a conformal layer that covers the outer surface of the carbon nano-tubes (CNTs) 704. Subsequently, the GaAs layer 706 is formed over the p-type layer 104 to encapsulate the carbon nano-tubes (CNTs) 704. In one embodiment, the solution based GaAs layer 706 may be formed on the p-type layer 104 and the carbon nano-tubes (CNTs) 704 by one or more processes described above with referenced to FIGS. 3 and 5. The light absorber layer 802 thus comprises the GaAs layer 706 that is disposed on the p-type layer 104 and the carbon nano-tubes (CNTs) 704. The carbon nano-tubes (CNTs) 704, which are encapsulated by the GaAs layer 706 and the p-type layer 104, will assist in the extraction of holes and electrons formed in the intrinsic light absorber layer 802, due to the increased surface area from which the charge can be collected and the CNT's high electrical conductivity. The intrinsic light absorber layer 802 can thus facilitate the collection of the charge carriers and increase the overall conversion efficiency of the formed solar cell device 840. Subsequently, a n-type layer 108 is formed on the intrinsic light absorber layer 802, and a second TCO layer 112 and the back electrode layer 110 is subsequently formed thereon, as discussed above in conjunction with FIG. 1.

It is believed that the structural configuration of the light absorber layer 802, discussed above, may also assist in the retention and absorption of the incident light, due to the increased number of light scattering surfaces, the orientation of the layer and the broader range of absorbed wavelengths, as compared to a conventional silicon based solar cell devices. Therefore, the conductive nano-tubes (CNTs) 704 and the GaAs material 706 formed in the light absorber layer 802 can increases the overall solar cell conversion efficiency.

Figure 9:
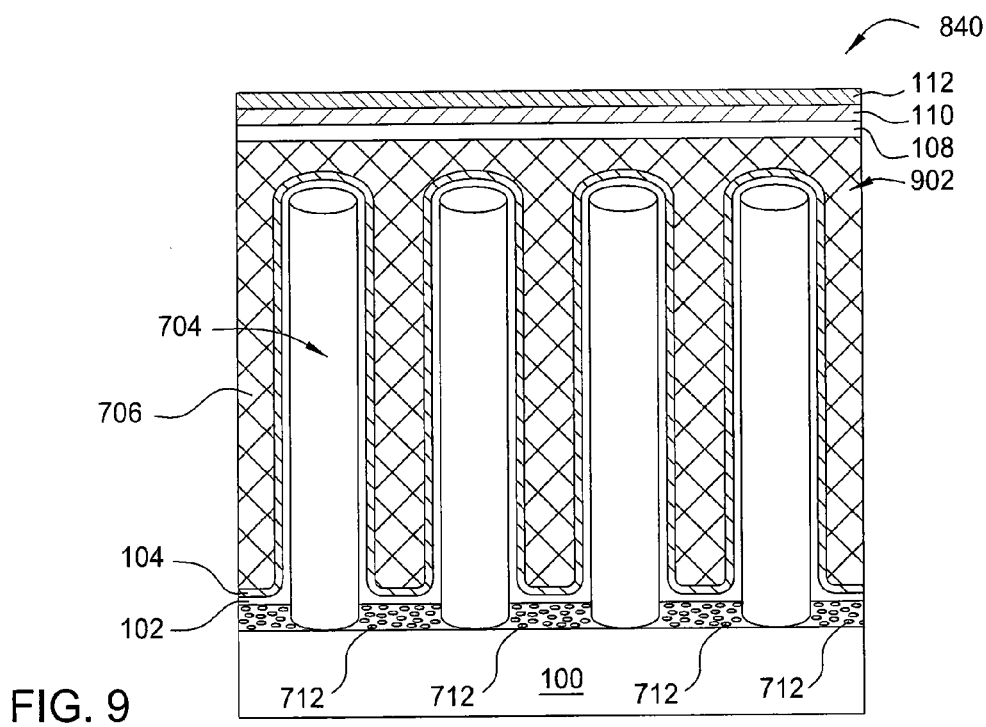
FIG. 9 depicts a cross sectional view of a solar cell device in accordance with another embodiment of the present invention.

FIG. 9 depicts a solar cell device 940 having an intrinsic light absorber layer 902 formed in the solar cell device 940. In this embodiment, as compared to the solar cell 840 illustrated in FIG. 8, the carbon nano-tubes (CNTs) 704 are first formed on the substrate 100. Optionally, a metal particle catalyst 712 is used and deposited on the substrate surface to assist in the growth of the carbon nano-tubes (CNTs) 704 on the surface of the substrate 100. Subsequently, the first TCO layer 102 is formed over the carbon nano-tubes (CNTs) 704, so that the deposited layer follows the profile of the carbon nano-tubes (CNTs) 704. Next, the p-type layer 104 is then formed on the first TCO layer 102. In one configuration, the deposited p-type layer 104 conformally follows the profile of the first TCO layer 102 and the carbon nano-tubes (CNTs) 704. Subsequently, the GaAs layer 706 is formed over the p-type layer 104 and carbon nano-tubes (CNTs) 704 to form the light absorber layer 902. In one embodiment, the solution based GaAs layer 706 may be formed on the substrate using one or more of the processes described above with referenced to FIGS. 3 and 5. The carbon nano-tubes (CNTs) 704, p-type layer 104, first TCO layer 102 and GaAs layer 706 all assist in the extraction of holes and electrons formed in the light absorber layer 902, thereby facilitating collection of the generated charge and increasing the overall conversion efficiency of the formed solar cell device. Subsequently, an n-type silicon layer 108 is formed on the light absorber layer 902, and a second TCO layer 110 and a back metal electrode 112 are subsequently formed thereon, as discussed above in conjunction with FIG. 1.

It is noted that the order for forming the p-i-n junction including the p-type layer 104, the light absorber layer 702, 802, 902 and the n-type layer 108, may be reversed as needed. For example, a n-i-p junction may also be formed utilizing the structure of the carbon nano-tubes 704 filled with the GaAs based material layer 706. For example, instead of forming the p-type layer 104 on the carbon nano-tubes 704, as depicted in FIGS. 8 and 9, the n-type layer 108 may be formed on the carbon nano-tubes 704 instead. Subsequently, the GaAs based material layer 706 may be formed over the n-type layer 108 and the carbon nano-tubes 704. After the continuous GaAs based material layer 706 is formed on the substrate 100, the p-type layer 104 is then formed thereon to form the desired n-i-p junction on the substrate as desired. It should be noted that in some configurations it may be desirable to form the p-type and/or n-type layers from materials other than silicon.

While the foregoing is directed to embodiments of the present invention, other and further embodiments of the invention may be devised without departing from the basic scope thereof, and the scope thereof is determined by the claims that follow.

What is claimed is:

1. A method of forming a thin film transistor, comprising:
   forming a first layer with a first type of dopants doped therein over a surface of a substrate;
   forming a GaAs based layer on the first layer by supplying a GaAs containing precursor disposed in a solvent to a processing chamber, wherein the GaAs containing precursor is selected from a group consisting of $(NMe_2)_2GaAs^tBuH$, $Me_2GaAs(NMe_2)_2$, $Me_2GaAs(SiMePh_2)_2$, $Me_2GaAs(SiPh_3)_2$, $Et_2GaAs(SiMe_2Cy)_2$, and $Me_2GaAs(SiMe_2Cy)_2$; and
   forming a second layer with a second type of dopants doped therein on the GaAs based layer.

2. The method of claim 1, wherein forming the GaAs based layer comprises:
   evaporating the GaAs containing precursor solvent in the processing chamber to form the GaAs based layer on the substrate.

3. The method of claim 1, wherein the GaAs containing precursor is $(NMe_2)_2GaAs^tBuH$.

4. The method of claim 1, further comprising:
   annealing the GaAs based layer formed on the substrate.

5. The method of claim 1, wherein the first type of dopants is a p-type dopant and the second type of dopants is a n-type dopant.

6. The method of claim 5, wherein the p-type dopant includes at least one of metallic zinc dopants, dimethyl zinc (DMZ), diethyl zinc (DEZ), metallic magnesium dopants, cyclopentadienyl magnesium, carbon chlorine ($CCl_4$) or carbon bromide ($CBr_4$).

7. The method of claim 5, wherein the n-type dopant includes at least one of $H_2S$, sulfur, silane ($SiH_4$), disilane ($Si_2H_6$), $H_2Se$, Se or the like.

8. The method of claim 1, wherein the first layer is a silicon containing layer or a GaAs based layer, and the second layer is a silicon containing layer or a GaAs based layer.

9. The method of claim 1, wherein the first layer is a p-type amorphous silicon layer and the second layer is a n-type amorphous silicon layer.

10. The method of claim 1, further comprising forming a plurality of carbon nanotubes over the surface of the substrate prior to forming the first layer on the substrate.

11. The method of claim 10, further comprising:
    filling the plurality of carbon nanotubes with a GaAs layer.

12. A method of forming a structure on a substrate suitable for use in a thin film transistor, comprising:
    supplying a GaAs containing precursor in a solvent to a processing chamber, the GaAs containing precursor having p-type or n-type dopants disposed therein, wherein the GaAs containing precursor is selected from a group consisting of $(NMe_2)_2GaAs^tBuH$, $Me_2GaAs(NMe_2)_2$, $Me_2GaAs(SiMePh_2)_2$, $Me_2GaAs(SiPh_3)_2$, $Et_2GaAs(SiMe_2Cy)_2$, and $Me_2GaAs(SiMe_2Cy)_2$; and evaporating the solvent from the GaAs containing precursor with p-type dopants or n-type dopants in the processing chamber to form a p-type doped or n-type doped GaAs layer on the substrate.

13. The method of claim 12, wherein the p-type dopants include at least one of metallic zinc dopants, dimethyl zinc (DMZ), diethyl zinc (DEZ), metallic magnesium dopants, cyclopentadienyl magnesium, carbon chlorine ($CCl_4$) or carbon bromide ($CBr_4$).

14. The method of claim 12, wherein the n-type dopants include at least one of $H_2S$, sulfur, silane ($SiH_4$), disilane ($Si_2H_6$), $H_2Se$, Se or the like.

15. The method of claim 12, further comprising:
annealing the doped GaAs layer formed on the substrate.

* * * * *

UNITED STATES PATENT AND TRADEMARK OFFICE
CERTIFICATE OF CORRECTION

PATENT NO. : 8,846,437 B2  
APPLICATION NO. : 13/250748  
DATED : September 30, 2014  
INVENTOR(S) : Singh et al.

Page 1 of 1

It is certified that error appears in the above-identified patent and that said Letters Patent is hereby corrected as shown below:

In the Specification

Column 7, Line 66, please delete "200" and insert --300-- therefor;

Column 7, Line 66, please delete "204" and insert --304-- therefor;

Column 11, Line 45, please delete "300" and insert --400-- therefor;

Column 11, Line 67, please delete "326" and insert --426-- therefor;

Column 12, Line 31, please delete "334" and insert --434-- therefor;

Column 12, Line 51, please delete "432" and insert --434-- before to therefor;

Column 12, Line 51, please delete "432" and insert --434-- after container therefor;

Column 14, Line 39, please delete "toluenene" and insert --toluene-- therefor;

Column 17, Line 33, please delete "306" and insert --706-- therefor;

Column 18, Line 46, please delete "306" and insert --706-- therefor;

Column 19, Line 18, please delete "112" and insert --110-- therefor;

Column 19, Line 19, please delete "110" and insert --112-- therefor.

Signed and Sealed this
Twenty-fourth Day of February, 2015

Michelle K. Lee
*Deputy Director of the United States Patent and Trademark Office*